(12) United States Patent
Liu

(10) Patent No.: US 11,792,975 B2
(45) Date of Patent: Oct. 17, 2023

(54) METHOD OF MANUFACTURING SEMICONDUCTOR MEMORY AND SEMICONDUCTOR MEMORY

(71) Applicant: CHANGXIN MEMORY TECHNOLOGIES, INC., Hefei (CN)

(72) Inventor: Xiang Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 102 days.

(21) Appl. No.: 17/647,469

(22) Filed: Jan. 10, 2022

(65) Prior Publication Data

US 2023/0019368 A1 Jan. 19, 2023

Related U.S. Application Data

(63) Continuation of application No. PCT/CN2021/113067, filed on Aug. 17, 2021.

(30) Foreign Application Priority Data

Jul. 9, 2021 (CN) .......................... 202110779768.3

(51) Int. Cl.
*H01L 27/108* (2006.01)
*H10B 12/00* (2023.01)

(52) U.S. Cl.
CPC ......... *H10B 12/485* (2023.02); *H10B 12/482* (2023.02)

(58) Field of Classification Search
CPC ........................... H10B 12/485; H10B 12/482
See application file for complete search history.

(56) References Cited

U.S. PATENT DOCUMENTS

2021/0066304 A1* 3/2021 Kang ................. H10B 12/0335
2022/0102353 A1* 3/2022 Kim ...................... H10B 12/34

* cited by examiner

*Primary Examiner* — Mohammed R Alam
(74) *Attorney, Agent, or Firm* — Cooper Legal Group, LLC

(57) ABSTRACT

The present disclosure provides a method of manufacturing a semiconductor memory and a semiconductor memory, and relates to the technical field of storage devices. The method of manufacturing the semiconductor memory includes: providing a substrate, where multiple active regions arranged at intervals are provided in the substrate; each of the active regions includes a first contact region and second contact regions; forming a bump on each of the second contact regions; forming multiple bit line (BL) structures arranged at intervals on the substrate; forming a first isolation layer covering the BL structures and covering the substrate, where multiple filling holes are provided in the first isolation layer; and forming a wire in each of the filling holes, the wire being electrically connected to the bump.

20 Claims, 9 Drawing Sheets

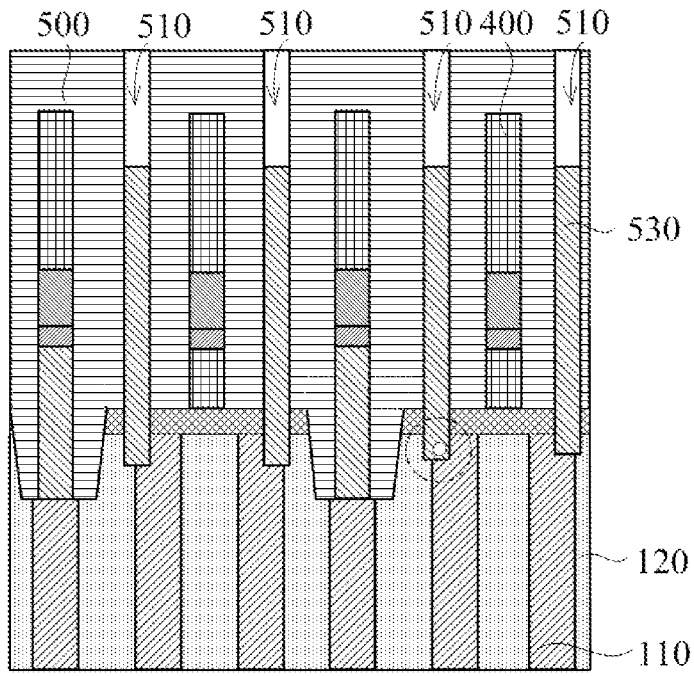

FIG. 1

Provide a substrate, where multiple active regions arranged at intervals are provided in the substrate; each of the active regions includes a first contact region and second contact regions located outside the first contact region; and the second contact regions are exposed on a surface of the substrate — S101

Form a bump on each of the second contact regions — S102

Form multiple bit line structures arranged at intervals on the substrate, where each of the bit line structures is electrically connected to at least one first contact region — S103

Form a first isolation layer covering the bit line structures and covering the substrate, where multiple filling holes are provided in the first isolation layer; one of the filling holes exposes one bump, and a surface area of the bump exposed in the filling hole is greater than an overlapping area of orthographic projection of the filling hole on the substrate and the second contact region — S104

Form a wire in each of the filling holes, where the wire is electrically connected to the bump — S105

FIG. 2

METHOD OF MANUFACTURING SEMICONDUCTOR MEMORY AND SEMICONDUCTOR MEMORY

CROSS-REFERENCE TO RELATED APPLICATIONS

This is a continuation of International Patent Application No. PCT/CN2021/113067, filed on Aug. 17, 2021, which claims the priority to Chinese Patent Application No. 202110779768.3, titled "METHOD OF MANUFACTURING SEMICONDUCTOR MEMORY AND SEMICONDUCTOR MEMORY" and filed to China National Intellectual Property Administration on Jul. 9, 2021. The entire contents of International Patent Application No. PCT/CN2021/113067 and Chinese Patent Application No. 202110779768.3 are incorporated herein by reference.

TECHNICAL FIELD

The present disclosure relates to the technical field of storage devices, in particular to a method of manufacturing a semiconductor memory and a semiconductor memory.

BACKGROUND

The dynamic random access memory (DRAM) is a semiconductor memory that randomly writes and reads data at high speed, and is widely used in data storage devices. The DRAM is generally composed of multiple memory cells. Each memory cell typically includes a capacitor and a transistor. The capacitor stores data information, and the transistor controls the reading and writing of data information in the capacitor.

In the related art, a DRAM includes a substrate, which includes active regions. Each of the active regions includes a first contact region and a second contact region. The substrate is provided with bit line (BL) structures arranged at intervals and an isolation layer covering the BL structures. Each of the BL structures is electrically connected to the first contact region of the active region, and the isolation layer is provided with contact holes. Each of the contact holes is filled with a wire, which is used to electrically connect a capacitor and the second contact region of the active region.

In order to increase the contact area between the wire and the second contact region, the contact hole typically extends into the substrate to increase the surface area of the second contact region exposed in the contact hole. However, in the fabrication process of the DRAM, the wire filled in the contact hole is prone to a void or a gap, which will affect the yield of the memory.

SUMMARY

In a first aspect, an embodiment of the present disclosure provides a method of manufacturing a semiconductor memory. The method of manufacturing the semiconductor memory includes: providing a substrate, where multiple active regions arranged at intervals are provided in the substrate; each of the active regions includes a first contact region and second contact regions located outside the first contact region; the second contact regions are exposed on a surface of the substrate; forming a bump on each of the second contact regions; forming multiple bit line (BL) structures arranged at intervals on the substrate, each of the BL structures being electrically connected to at least one first contact region; forming a first isolation layer covering the BL structures and covering the substrate, where multiple filling holes are provided in the first isolation layer; one of the filling holes exposes one bump, and a surface area of the bump exposed in the filling hole is greater than an overlapping area of orthographic projection of the filling hole on the substrate and the second contact region; and forming a wire in the each of filling holes, the wire being electrically connected to the bump.

In a second aspect, an embodiment of the present disclosure provides a semiconductor memory. The semiconductor memory includes: a substrate, where the substrate is provided with multiple active regions arranged at intervals; and each of the active regions includes a first contact region and second contact regions located outside the first contact region; multiple BL structures, where the BL structures are arranged at intervals on the substrate, and each of the bit line structures is electrically connected to at least one first contact region; a bump, arranged on each of the second contact regions; a first isolation layer, where the first isolation layer covers the BL structures, the bump and the substrate; the first isolation layer is provided with multiple filling holes, and each of the multiple filling holes extends to the bump; and a wire arranged in each of the filling holes, where the wire is electrically connected to the bump; and a contact area of the wire and the bump is greater than an overlapping area of orthographic projection of the filling hole on the substrate and the second contact region.

BRIEF DESCRIPTION OF THE DRAWINGS

FIG. 1 is a view illustrating a structure of a semiconductor memory in the related art.

FIG. 2 is a flowchart of a method of manufacturing a semiconductor memory according to an embodiment of the present disclosure.

DETAILED DESCRIPTION

Figure 3:
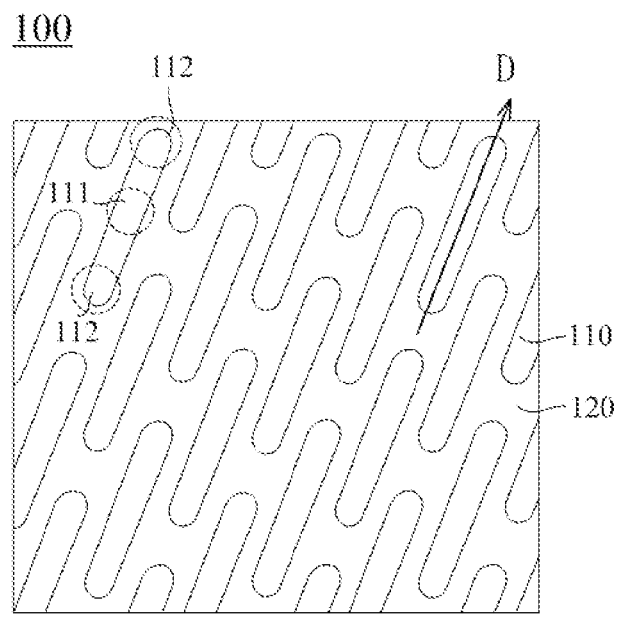
FIG. 3 is a top view of a substrate according to an embodiment of the present disclosure.

Referring to FIG. 1, in the related art, during the fabrication process of a semiconductor memory, a filling hole 510 is formed in a first isolation layer 500. A substrate is etched along the filling hole 510 such that the bottom of the filling hole 510 is located in the substrate, and then a wire 530 is formed in the filling hole 510. When the wire 530 is deposited in the filling hole 510, since the filling hole 510 is too deep, the wire 530 is likely to form a void or a gap, as indicated by a dashed-dotted circle in FIG. 1. The void or gap will affect the charge transfer capability of the wire 530, thereby reducing the performance of the semiconductor memory and even the yield of the semiconductor memory.

In view of this, an embodiment of the present disclosure provides a method of manufacturing a semiconductor memory. The method of manufacturing the semiconductor memory includes: form a bump on a region (a second contact region) of a substrate corresponding to a filling hole; form a first isolation layer covering the substrate and covering the bump, where the filling hole is provided in the first isolation layer, and exposes the bump; a surface area of the bump exposed in the filling hole is greater than an overlapping area of orthographic projection of the filling hole on the substrate and the second contact region; and form a wire in the filling hole. A contact area between the wire and the bump is greater than an overlapping area of the wire and the second contact region when the bump is not provided, thereby reducing the contact resistance between the wire and the bump. In addition, compared with the related art, since the bump on the substrate is formed in the filling hole, the depth of the filling hole is reduced, which reduces the possibility of a void or a gap formed in the wire in the filling hole, thereby improving the formation quality of the wire and improving the yield of the memory.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are some rather than all of the embodiments of the present disclosure. All other embodiments obtained by those of ordinary skill in the art based on the embodiments of present disclosure without creative efforts should fall within the protection scope of the present disclosure.

Referring to FIG. 2, an embodiment of the present disclosure provides a method of manufacturing a semiconductor memory. The method of manufacturing the semiconductor memory includes the following steps:

S101: Provide a substrate, where multiple active regions arranged at intervals are provided in the substrate; each of the active regions includes a first contact region and second contact regions located outside the first contact region; and the second contact regions are exposed on a surface of the substrate.

Referring to FIG. 3, a substrate 100 is provided to support various film layers thereon. The substrate 100 is provided with active regions 110. There may be multiple active regions 110, and as shown in FIG. 3, the multiple active regions 110 are arranged in an array. It is understandable that central regions of the multiple active regions 110 are arranged in a dot array.

The multiple active regions 110 are arranged at intervals. For example, a shallow trench isolation (STI) structure 120 is provided between the active regions 110, and the multiple active regions 110 are separated by the STI structure 120. The substrate 100 may be a semiconductor substrate, for example, a silicon substrate, a germanium substrate, a silicon carbide (SiC) substrate, a silicon-germanium (SiGe) substrate or a silicon on insulator (SOI) substrate.

Trenches are formed in the substrate 100 through a patterning process, and an insulating material (such as silicon oxide or silicon oxynitride) is filled in the trenches, thereby defining the multiple active regions 110 separated by the STI structure 120 on the substrate 100. In some embodiments, the patterning process may be a self-aligned double patterning (SADP) process or a self-aligned quadruple patterning (SAQP) process.

Referring to FIG. 3, the active regions 110 are arranged obliquely and extend in a D direction shown in FIG. 3. Each of the active regions 110 includes a first contact region 111 and second contact regions 112. The second contact regions 112 are located outside the first contact region 111. The first contact region 111 and the second contact regions 112 are exposed on a surface of the substrate 100. The first contact region 111 is used to electrically connect a bit line (BL) structure, and the second contact regions 112 are used to electrically connect a capacitor. In some embodiments, as shown in FIG. 3, the first contact region 111 is located in a central region of the active region 110, and the second contact regions 112 are located in peripheral regions of the active region 110. That is, the second contact regions 112 may be provided on two sides of the first contact region 111, respectively.

Figure 4:
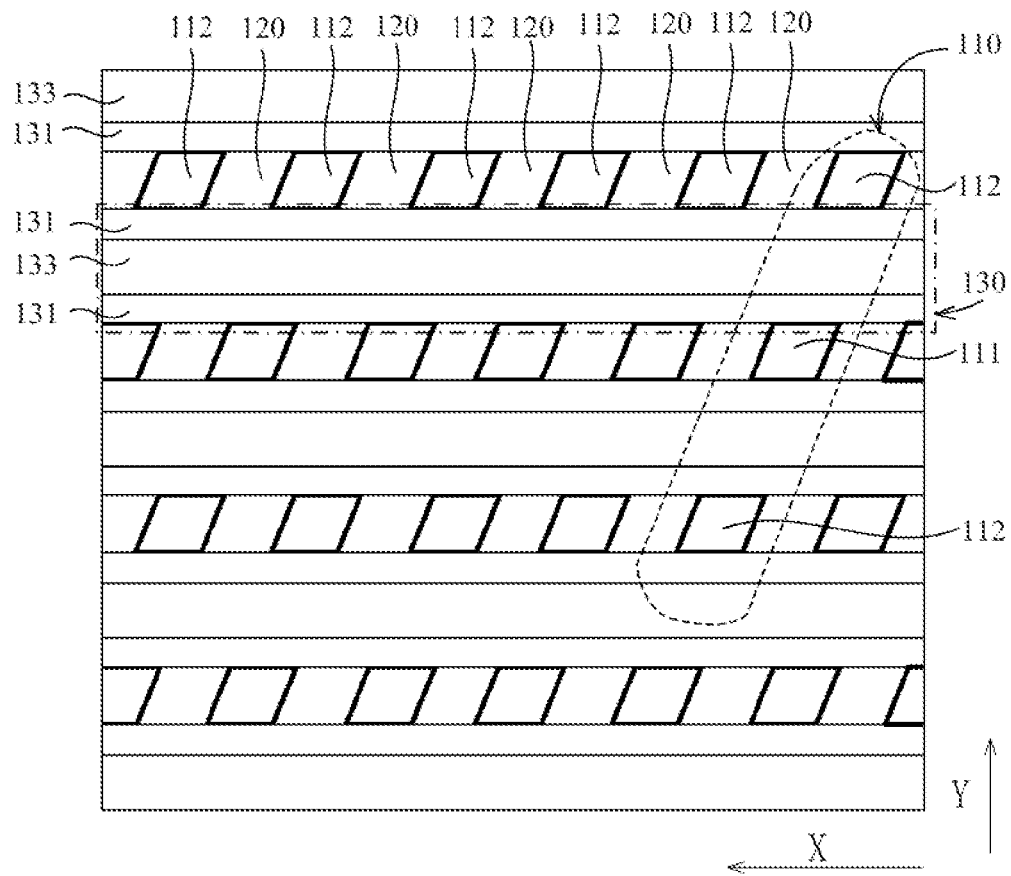
FIG. 4 is a top view of a word line (WL) structure according to an embodiment of the present disclosure.
Figure 5:
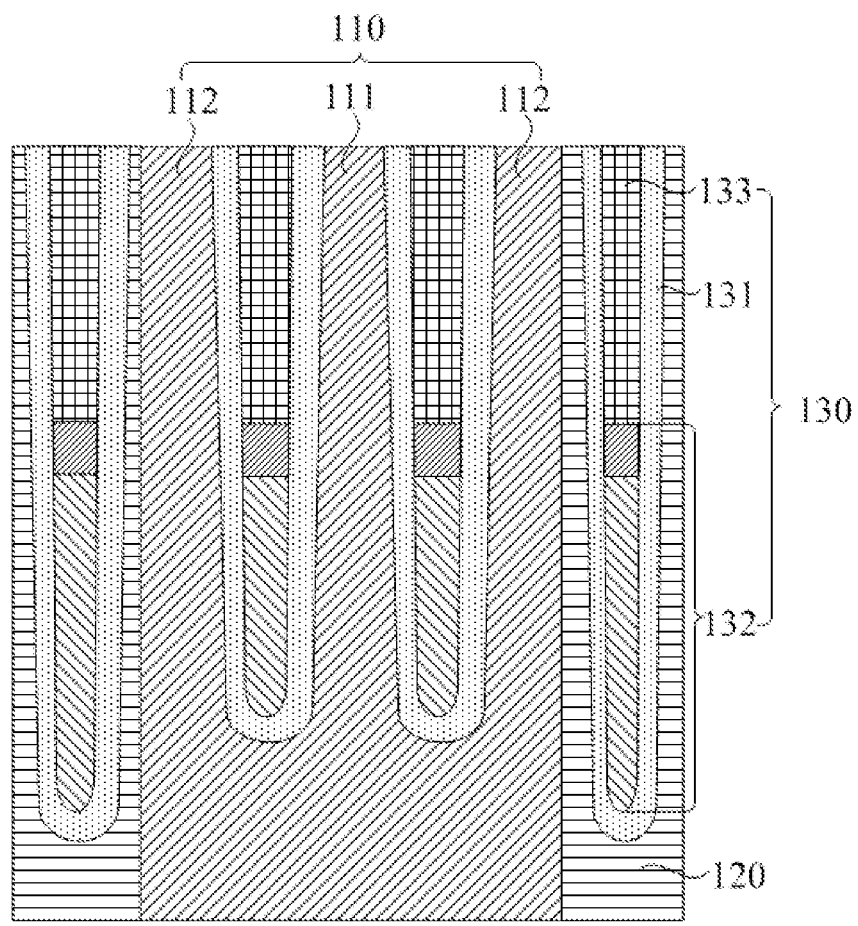
FIG. 5 is a view illustrating a structure of the substrate according to an embodiment of the present disclosure.

It should be noted that, referring to FIGS. 4 and 5, FIG. 5 shows a cross section perpendicular to an X direction in FIG. 4. The substrate 100 is further provided therein with word line (WL) structures 130. The WL structures 130 are generally buried word line (BWL) structures 130. There may be multiple BWL structures 130. The multiple BWL structures 130 extend in a second direction and cross the active regions 110 to separate the first contact region 111 and the second contact regions 112 of each of the active regions 110.

As shown in FIG. 4, the multiple BWL structures 130, each indicated by a dashed-dotted line in FIG. 4, extend in the X direction. Each of the BWL structures 130 passes through multiple active regions 110 located in the same row, and the active regions 110 each correspond to two BWL structures 130. As shown in FIG. 4, the active region 110 is indicated by a dashed line. Two BWL structures 130 divide the active region 110 into one first contact region 111 at the center and two second contact regions 112 at two sides.

As shown in FIGS. 4 and 5, each of the BWL structures 130 includes a second insulating layer 131, a fourth conductive layer 132 and a cap layer 133. The second insulating layer 131 is in contact with the active region 110, and the second insulating layer 131 surrounds a filling groove. The fourth conductive layer 132 and the cap layer 133 on the fourth conductive layer 132 are arranged in the filling groove. An upper surface of the cap layer 133 is flush with that of the substrate 100. As shown in the top view of FIG. 4, the upper surface of the cap layer 133 and the upper surface of the second insulating layer 131 are exposed, and the cap layer 133 is located in the middle position surrounded by the second insulating layer 131. The material of the second insulating layer 131 includes silicon oxide. The material of the fourth conductive layer 132 includes one or more of the group consisting of titanium, tantalum, titanium nitride, tungsten nitride, tantalum nitride and tungsten-nitride-silicon. The material of the cap layer 133 includes silicon nitride.

S102: Form a bump on each of the second contact regions.

Figure 6:
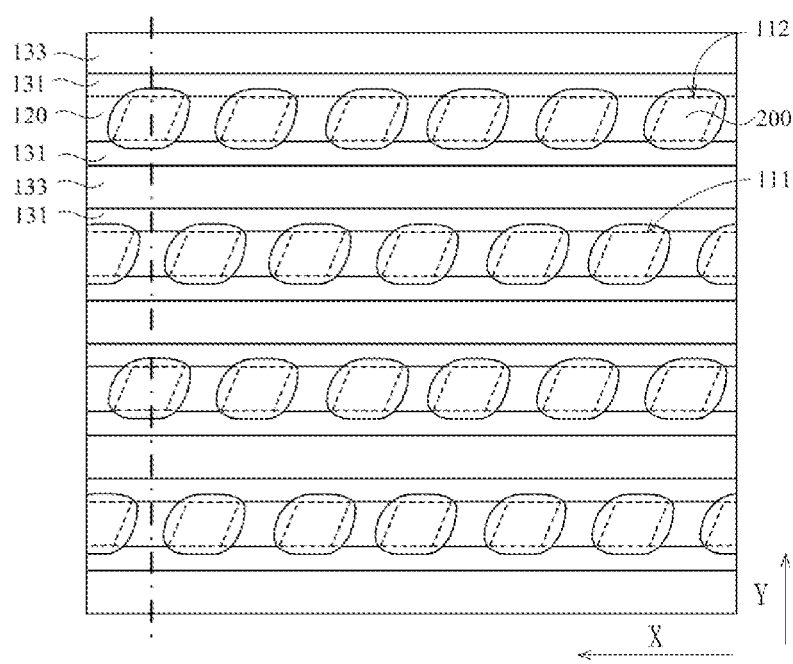
FIG. 6 is a top view illustrating a structure after a bump is formed according to an embodiment of the present disclosure.

Referring to FIG. 6, multiple bumps 200 are provided, and the multiple bumps 200 correspond to multiple second contact regions 112 respectively, that is, one bump 200 is formed on one second contact region 112. Orthographic projection of the bump 200 on the substrate 100 at least covers the second contact region 112, that is, the second contact region 112 is located within the orthographic projection of the bump 200 on the substrate 100. As shown in the top view of FIG. 6, the second contact region 112 is indicated by a dashed line, and the second contact region 112 is located under the bump 200, that is, the second contact region 112 is not exposed.

Figure 7:
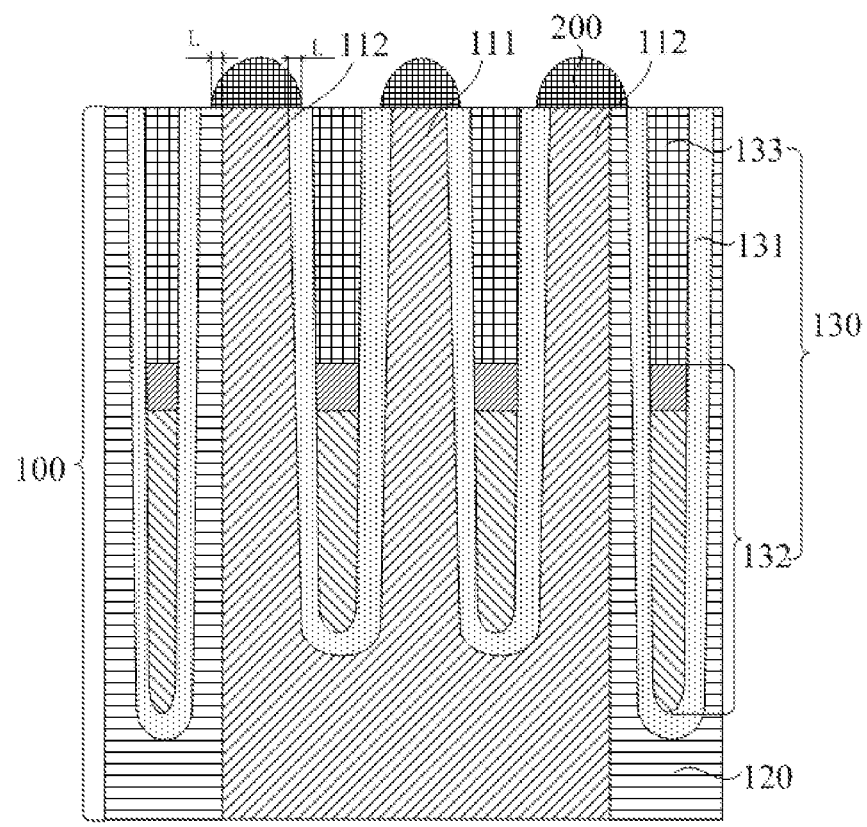
FIG. 7 is a view illustrating a structure after the bump is formed according to an embodiment of the present disclosure.

In some embodiments, the orthographic projection of the bump 200 on the substrate 100 and the second contact region 112 have the same shape, such as a parallelogram. As shown in FIG. 7, a distance L between an edge of the orthographic projection of the bump 200 on the substrate 100 and an edge of the second contact region 112 is 3-5 nm.

In some embodiments, referring to FIG. 7, FIG. 7 shows a cross section perpendicular to the extension direction of the WL structures 130 (the X direction in FIG. 6). A surface of the bump 200 facing away from the substrate 100 is a curved surface, such that the area of the surface of the bump 200 facing away from the substrate 100 is greater than a surface area of the second contact region 112 exposed to the substrate 100. In this way, a subsequently formed wire 530 and the bump 200 have a large contact area, thereby reducing the contact resistance between the wire 530 and the bump 200. As shown in FIG. 7, the surface of the bump 200 away from the substrate 100 is arc-shaped. In some embodiments, the sectional shape of the bump 200 is arcuate, semicircular or semi-elliptical.

The bump 200 may be formed by epitaxial growth on the second contact region 112, that is, the bump 200 is formed on each of the second contact regions 112 by epitaxial growth. Through epitaxial growth, the bump 200 is different from the second contact region 112 in terms of conductivity type, resistivity, and the type and concentration of doping ions. In some embodiments, the bump 200 and the active region 110 may be made of the same material, for example, silicon. The bump 200 and the active region 110 are doped with preset ions. The preset ions in the bump 200 and the preset ions in the active region 110 may be of the same type, for example, one of N-type ions or P-type ions. The doping concentration of the bump 200 is greater than that of the active region 110, such that the electrical contact resistance between the wire 530 and the bump 200 is less than that between the wire 530 and the second contact region 112 of the active region 110.

It should be noted that, as shown in FIGS. 6 and 7, when the first contact region 111 and the second contact regions 112 are both exposed on the surface of the substrate 100, one bump 200 is formed on each of the second contact regions 112 while one bump 200 is formed on the first contact region 111. That is, the bumps 200 are formed on the first contact region 111 and the second contact regions 112 at the same time, so as to reduce the difficulty of forming the bumps 200 and facilitate the fabrication of the semiconductor memory. As shown in FIG. 6, after the bumps 200 are formed, the bumps 200 are arranged in a dot array.

S103: Form multiple BL structures arranged at intervals on the substrate, each of the BL structures being electrically connected to at least one first contact region.

Figure 8:
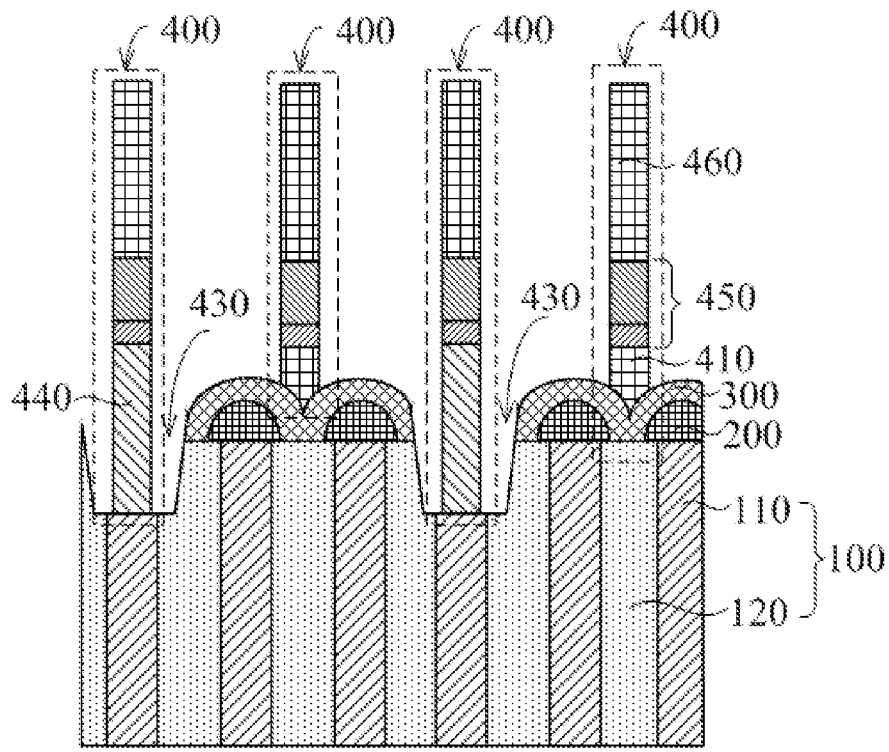
FIG. 8 is a view illustrating a structure after a bit line (BL) structure is formed according to an embodiment of the present disclosure.

Referring to FIG. 8, multiple BL structures arranged at intervals are formed on the substrate 100. The multiple BL structures 400 are parallel and extend in a first direction. Each BL is electrically connected to at least one first contact region 111. As shown in FIG. 8, the BL structures 400 extend in a direction perpendicular to the plane of the paper (a Y direction shown in FIG. 6). Each of the BL structures 400 is in contact with the first contact regions 111 (as indicated by a dashed-dotted line in FIG. 6) of multiple active regions 110 located in the same column. The first contact region 111 of each of the active regions 110 corresponds to one BL structure 400. By contacting the BL structure 400 with the first contact region 111, the BL structure 400 is electrically connected to the first contact region 111.

It is understandable that the first direction and the second direction may be perpendicular to each other. For example, in the top view of FIG. 6, the first direction is a vertical direction (Y direction), and the second direction is a horizontal direction (X direction). The active regions 110 are arranged obliquely. Referring to FIGS. 6 to 8, the WL structures 130 are located in the substrate 100 and pass through the active regions 110 in the second direction. The BL structures 400 are located on the substrate 100 and contact the active regions 110 in the first direction. A first insulating layer 300 is provided between the BL structures 400 and other regions of the substrate 100, such that the BL structures 400 are only electrically connected to the first contact regions 111.

The BL structures 400 may be formed through a deposition process. For example, the BL structures 400 are formed through a chemical vapor deposition (CVD) process, a physical vapor deposition (PVD) process or an atomic layer deposition (ALD) process.

S104: Form a first isolation layer covering the BL structures and the covering substrate, where multiple filling holes are provided in the first isolation layer; one of the filling holes exposes one bump, and a surface area of the bump exposed in the filling hole is greater than an overlapping area of orthographic projection of the filling hole on the substrate and the second contact region.

Figure 9:
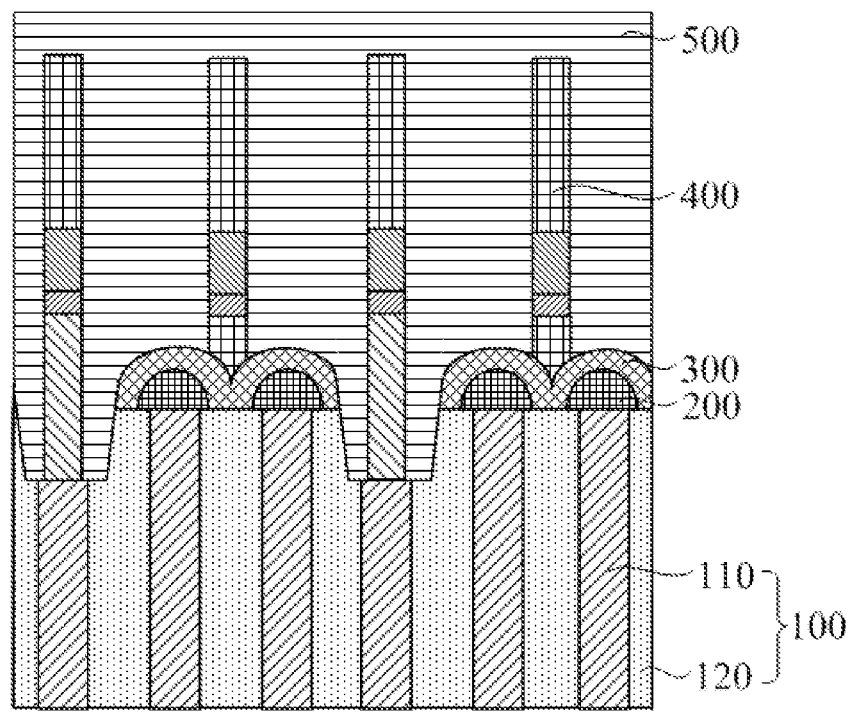
FIG. 9 is a view illustrating a structure after a first isolation layer is formed according to an embodiment of the present disclosure.

Referring to FIG. 9, a first isolation layer 500 is provided on the substrate 100 and covers the BL structures 400. It supports and isolates the BL structures 400, and serves as a substrate body of filling holes 510. The first isolation layer 500 may be made of an insulating material, such as silicon nitride.

Figure 10:
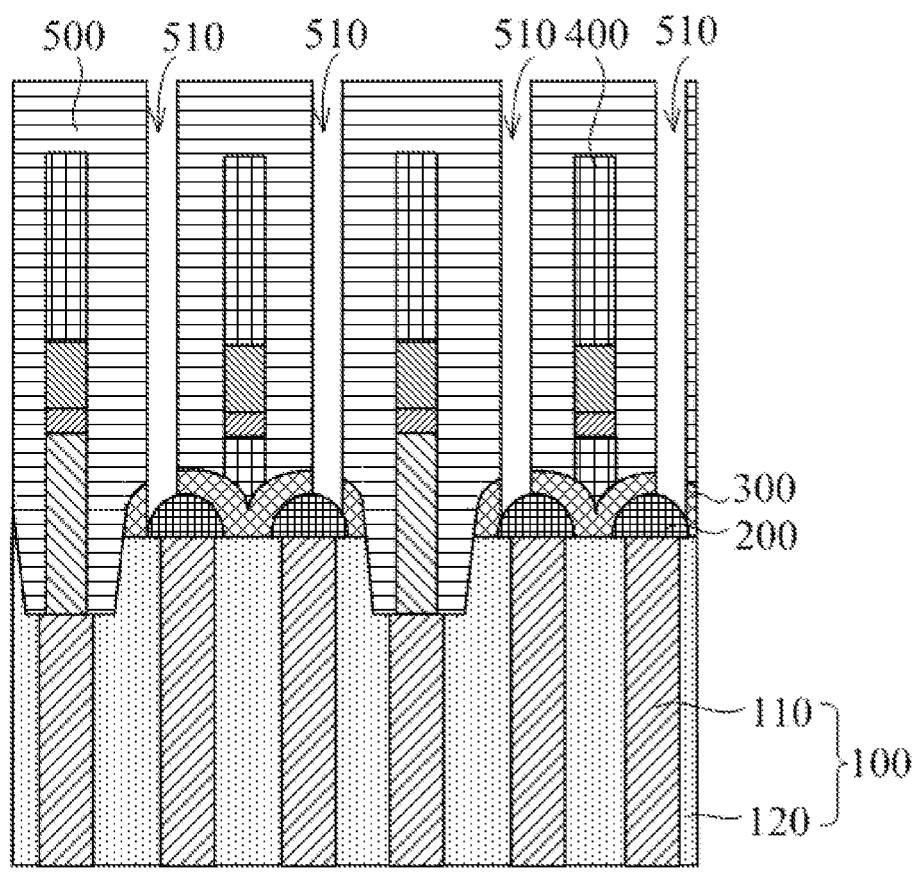
FIG. 10 is a view illustrating a structure after a filling hole is formed according to an embodiment of the present disclosure.

Referring to FIG. 10, multiple filling holes 510 are formed in the first isolation layer 500. The multiple filling holes 510 are arranged at intervals, and each of the filling holes 510 exposes one bump 200, that is, the multiple filling holes 510 correspond to the multiple bumps 200 respectively. A surface area of the bump 200 exposed in the filling hole 510 is greater than an overlapping area of orthographic projection of the filling hole 510 on the substrate 100 and the second contact region 112. In this way, the subsequently formed wire 530 and the bump 200 have a large contact area, thereby improving the electrical performance between the wire 530 and the bump 200.

In some embodiments, the step of forming the first isolation layer 500 covering the BL structures 400 and covering the substrate 100 is described below, where the first isolation layer 500 is provided therein with multiple filling holes 510; each of the filling holes 510 exposes one bump 200; and the surface area of the bump exposed 200 in the filling hole 510 is greater than the overlapping area of the orthographic projection of the filling hole 510 on the substrate 100 and the second contact region 112:

The first isolation layer 500 is deposited on the BL structures 400, such that the first isolation layer 500 covers the BL structures 400 and the first insulating layer 300. The first isolation layer 500 covers the BL structures 400, and a surface of the first isolation layer 500 away from the substrate 100 is flush.

After the first isolation layer 500 is deposited on the BL structures 400, the first isolation layer 500 is etched to form the filling holes 510, where each of the filling holes 510 penetrates the first isolation layer 500 and is opposite to one bumps 200.

After the filling holes 510 are formed, the first insulating layer 300 is etched along the filling holes 510. Each of the filling holes 510 penetrates the first insulating layer 300 such that the filling hole 510 expose one bump 200. By using the bumps 200 as an etch stop layer, the first insulating layer 300 is etched along the filling holes 510. The bottom of the filling holes 510 is a surface of the bumps 200. For example, the filling holes 510 expose a part of the curved surface of the bumps 200, and the exposed surface area of the bumps 200 is greater than a sectional area of the filling holes 510.

S105: Form a wire in each of the filling holes, the wire being electrically connected to the bump.

Figure 11:
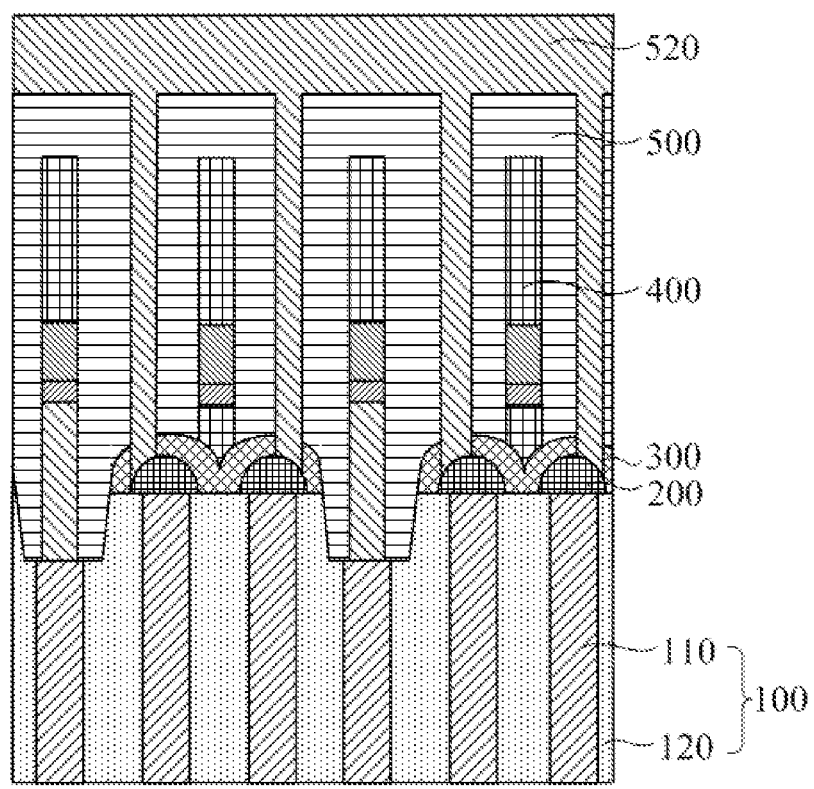
FIG. 11 is a view illustrating a structure after a third conductive layer is formed according to an embodiment of the present disclosure.
Figure 12:
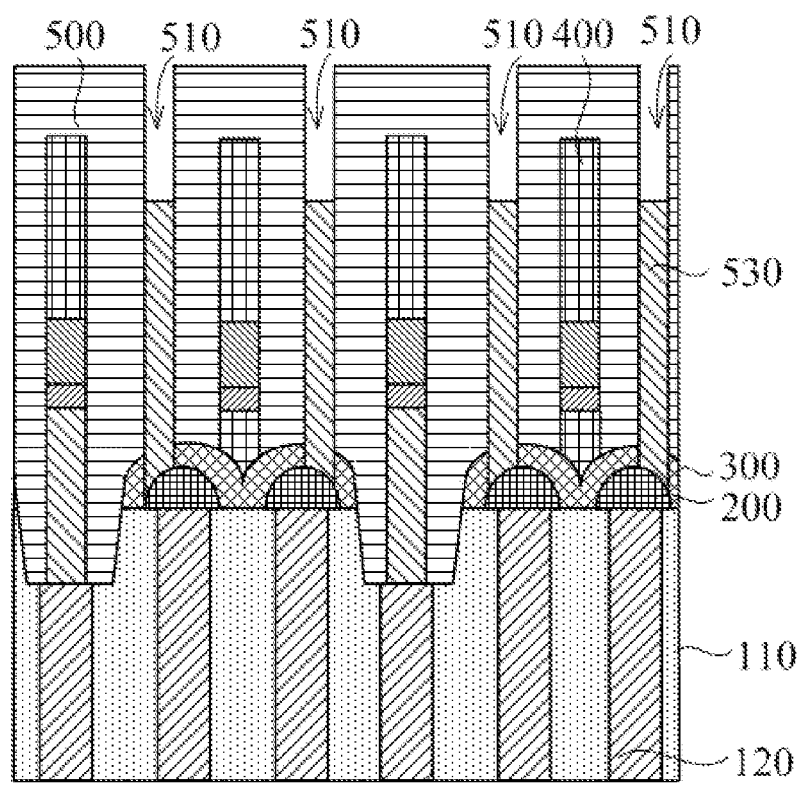
FIG. 12 is a view illustrating a structure after a wire is formed according to an embodiment of the present disclosure.

Referring to FIGS. 11 to 12, the wire 530 fills the filling hole 510 and is in contact with the bump 200. The wire 530 and the bump 200 are made of a conductive material, and are electrically connected by contact. In some embodiments, the step of forming the wire 530 in each of the filling holes 510, the wire 530 being electrically connected to the bump 200 includes:

A third conductive layer 520 is deposited in the filling holes 510 and on the first isolation layer 500. The third conductive layer 520 fills the filling holes 510 and covers the first isolation layer 500. As shown in FIG. 11, the third conductive layer 520 covers the first isolation layer 500 and the substrate 100, and a top surface of the third conductive layer 520 is higher than that of the first isolation layer 500, where a height direction refers to a direction away from the substrate 100. The third conductive layer 520 may be made of polysilicon.

After the third conductive layer 520 is deposited, the third conductive layer 520 is etched, so as to remove the third conductive layer 520 located on the first isolation layer 500 and a part of the third conductive layer 520 located in the filling holes 510, such that the retained third conductive layer 520 forms the wire 530. As shown in FIG. 12, after the third conductive layer 520 is deposited, the third conductive layer 520 is back-etched to remove a part of the third conductive layer 520, and the retained third conductive layer 520 forms multiple wires 530 that are arranged at intervals. A top surface of each of the wires 530 is lower than the surface of the first isolation layer 500.

Figure 13:
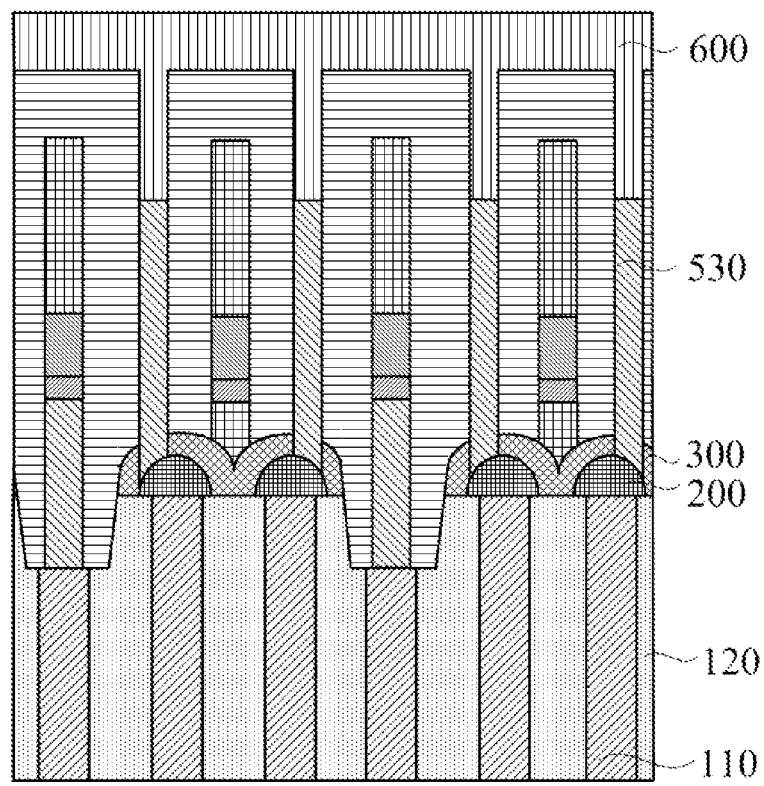
FIG. 13 is a view illustrating a structure after a fifth conductive layer is formed according to an embodiment of the present disclosure.
Figure 14:
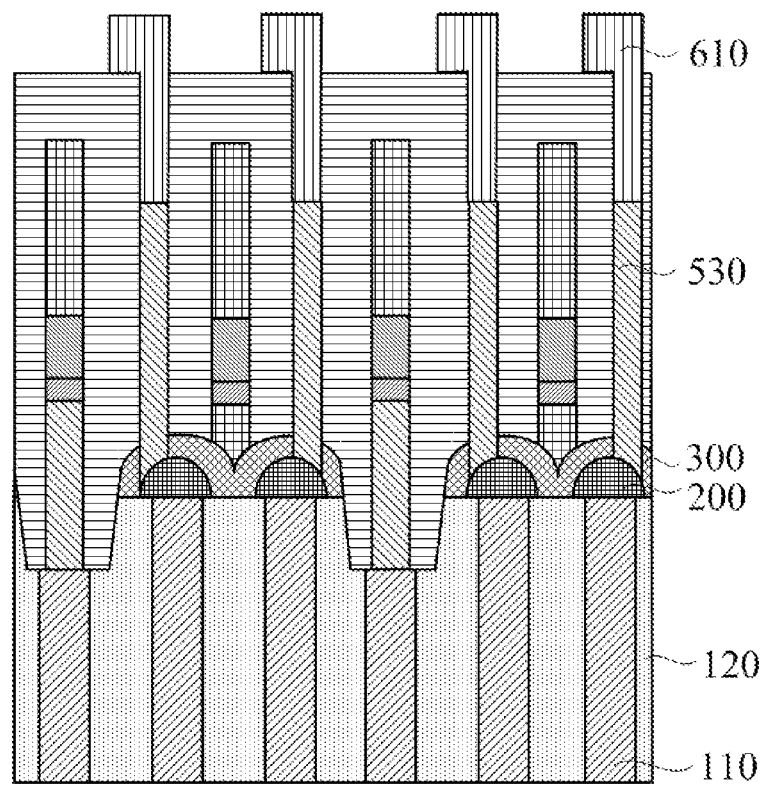
FIG. 14 is a view illustrating a structure after a contact pad is formed according to an embodiment of the present disclosure.

It should be noted that, referring to FIGS. 13 and 14, after the step of forming the wire 530 in each of the filling holes 510, the wire 530 being electrically connected to the bump 200, the method of manufacturing the semiconductor memory further includes: form a contact pad 610 on the wire 530 in each of the filling holes 510. Multiple contact pads 610 are arranged at intervals, and the contact pad 610 is partially located in the filling holes 510 and partially located on the first isolation layer 500.

As shown in FIG. 13, a fifth conductive layer 600 is formed in the retained filling holes 510 and on the first isolation layer 500. The fifth conductive layer 600 fills the retained filling holes 510 and covers the first isolation layer 500. The fifth conductive layer 600 includes a cobalt silicide layer, a titanium nitride layer and a tungsten layer that are sequentially stacked. The fifth conductive layer 600 on the first isolation layer 500 is etched to form multiple contact pads 610 that are arranged at intervals. As shown in FIG. 14, a lower part of the contact pad 610 is located in the filling hole 510, and an upper part of the contact pad 610 is located on the first isolation layer 500. The contact pads 610 are arranged at intervals so as to electrically isolate the contact pads 610.

In the method of manufacturing the semiconductor memory in the embodiment of the present disclosure, the substrate 100 is provided first. Multiple active regions 110 arranged at intervals are provided in the substrate 100. Each of the active regions 110 includes a first contact region 111 and second contact regions 112 located outside the first contact region 111, and the second contact region 112 is exposed on the surface of the substrate 100. A bump 200 is formed on each of the second contact regions 112. Multiple BL structures 400 arranged at intervals are formed on the substrate 100, and each of the BL structures 400 is electrically connected to at least one first contact region 111. The first isolation layer 500 covering the BL structures 400 and covering the substrate 100 is formed. Multiple filling holes 510 are provided in the first isolation layer 500. Each of the filling holes 510 exposes one bump 200, and the surface area of the bump 200 exposed in the filling hole 510 is greater than the overlapping area of the orthographic projection of the filling hole 510 on the substrate 100 and the second contact region 112. The wire 530 is formed in the filling hole 510, and the wire 530 is electrically connected to the bump 200. The bump 200 is formed on the second contact region 112, and the surface area of the bump 200 exposed in the filling hole 510 is greater than the overlapping area of the orthographic projection of the filling hole 510 on the substrate 100 and the second contact region 112. In this way, the contact area between the wire 530 formed in the filling hole 510 and the bump 200 is large, which reduces the contact resistance between the wire 530 and the bump 200. In addition, compared with the related art, since the bump 200 on the substrate 100 is formed in the filling hole 510, the depth of the filling hole 510 is reduced. When the wire 530 is formed in the filling hole 510, the probability of a void or a gap formed in the wire 530 is reduced, thereby improving the formation quality of the wire 530 and improving the yield of the memory.

Figure 15:
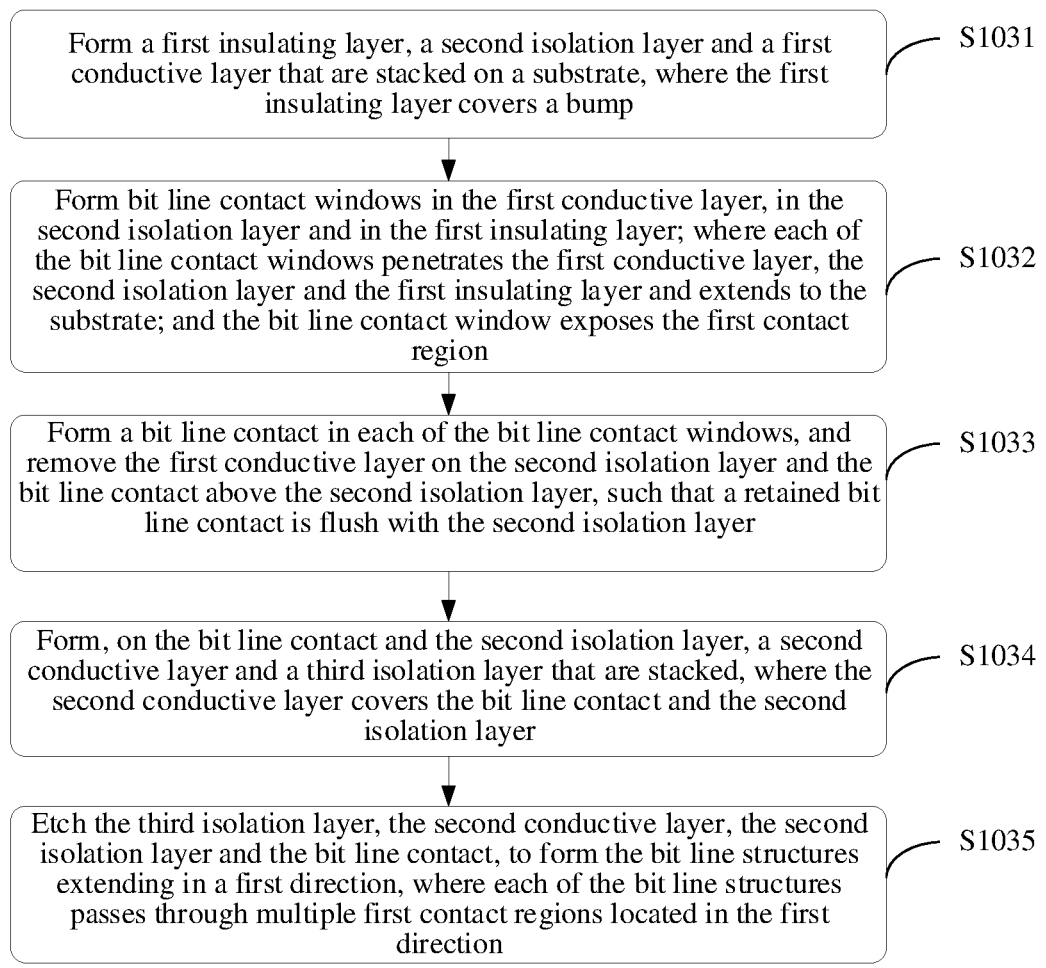
FIG. 15 is a flowchart of forming a BL structure according to an embodiment of the present disclosure.

It should be noted that, referring to FIG. 15, the step of forming multiple BL structures 400 arranged at intervals on the substrate 100, each of the BL structures 400 being electrically connected to at least one first contact region 111 includes:

S1031: Form a first insulating layer, a second isolation layer and a first conductive layer that are stacked on the substrate, where the first insulating layer covers the bump.

Figure 16:
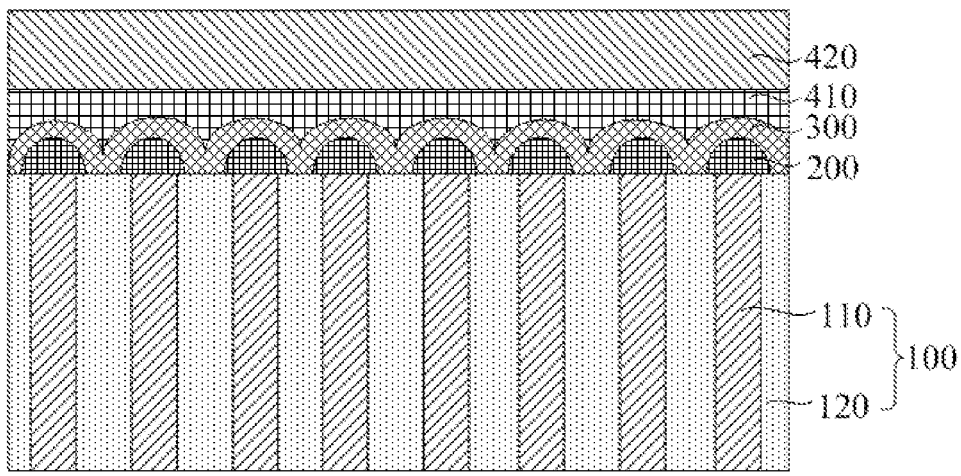
FIG. 16 is a view illustrating a structure after a first conductive layer is formed according to an embodiment of the present disclosure.

Referring to FIG. 16, a first insulating layer 300 is deposited on the substrate 100, where the first insulating layer 300 covers the bump 200. Then a second isolation layer 410 is deposited on the first insulating layer 300, and a first conductive layer 420 is deposited on the second isolation layer 410. The first insulating layer 300, the second isolation layer 410 and the first conductive layer 420 are stacked. The material of the first insulating layer 300 includes silicon oxide, the material of the second isolation layer 410 includes silicon nitride, and the material of the first conductive layer includes polysilicon.

S1032: Form bit line contact (BLC) windows in the first conductive layer, in the second isolation layer and in the first insulating layer; where each of the BLC windows penetrates the first conductive layer, the second isolation layer and the first insulating layer and extends to the substrate; and the BLC window exposes the first contact region.

Figure 17:
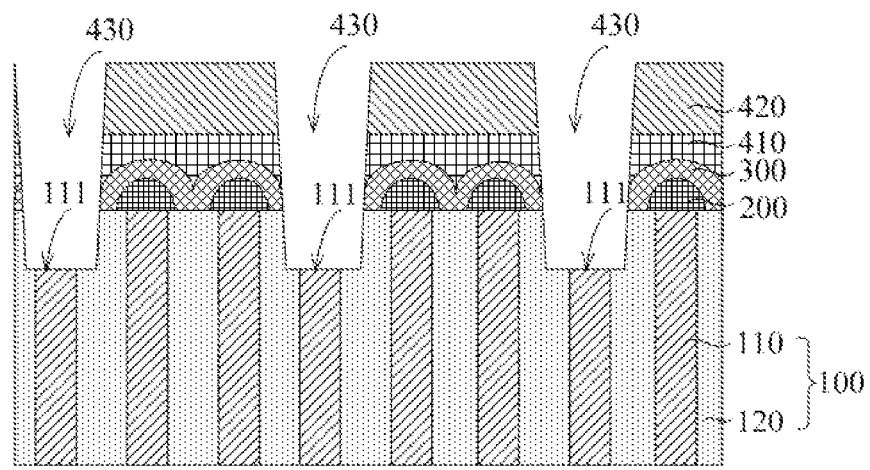
FIG. 17 is a view illustrating a structure after a bit line contact (BLC) window is formed according to an embodiment of the present disclosure.

Referring to FIG. 17, the bottom of the BLC window 430 is located in the substrate 100 and exposes the first contact region 111. The retained first conductive layer 420, second isolation layer 410 and first insulating layer 300 form multiple cylindrical bosses arranged at intervals, and each BLC window 430 surrounds one cylindrical boss.

S1033: Form a BLC in each of the BLC windows, and remove the first conductive layer on the second isolation layer and the BLC above the second isolation layer, such that the retained BLC is flush with the second isolation layer.

Figure 18:
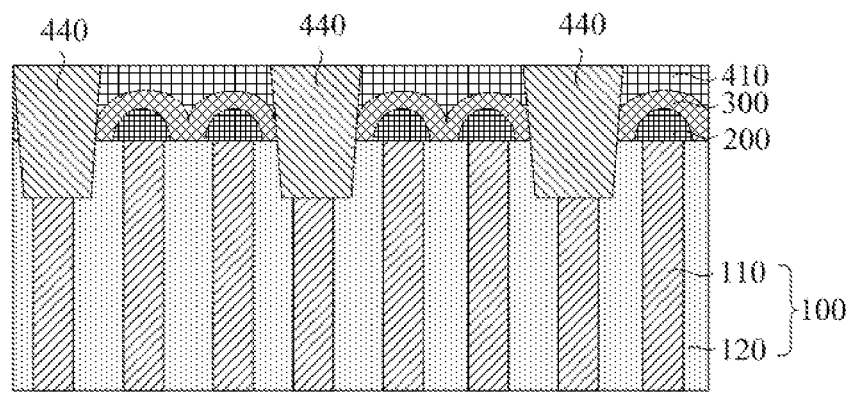
FIG. 18 is a view illustrating a structure after a BLC is formed according to an embodiment of the present disclosure.
Figure 19:
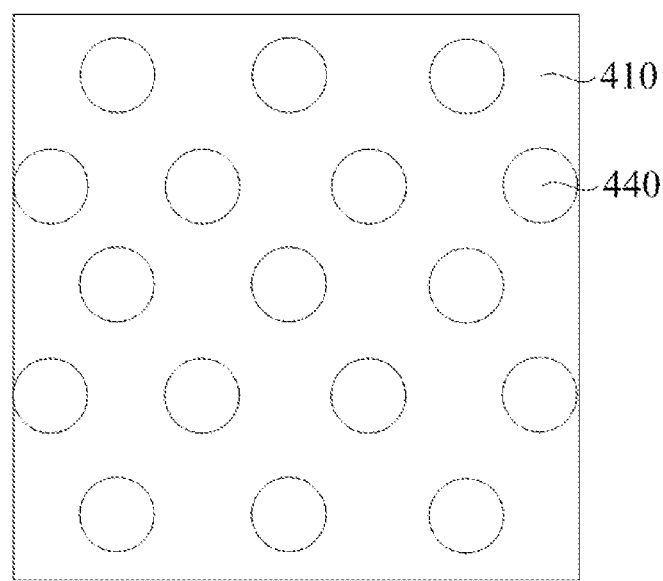
FIG. 19 is a top view illustrating a structure after the BLC is formed according to an embodiment of the present disclosure.

Referring to FIGS. 18 and 19, the BLC 440 is filled in the BLC window 430, and the BLC 440 may be made of polysilicon. The first conductive layer 420 on the second isolation layer 410 and a part of the BLC 440 above the second isolation layer are removed, and a top surface of the retained BLC 440 is flush with a top surface of the second isolation layer 410 so as to form a flat film layer thereon.

S1034: Form, on the BLC and the second isolation layer, a second conductive layer and a third isolation layer that are stacked, where the second conductive layer covers the BLC and the second isolation layer.

A second conductive layer 450 is deposited on the retained BLC 440 and the second isolation layer 410, and the second conductive layer 450 covers the BLC 440 and the second isolation layer 410. A third isolation layer 460 is deposited on the second conductive layer 450. The material of the third isolation layer 460 may include silicon nitride.

In some embodiments, the second conductive layer 450 includes a titanium layer, a metal compound layer and a tungsten layer. The titanium layer, the metal compound layer and the tungsten layer are provided, and the titanium layer is in contact with the BLC 440. The material of the metal compound layer may be a cobalt silicon compound. For example, cobalt is deposited on the BLC 440, and it is combined with silicon in the BLC 440 at a high temperature to generate a cobalt-silicon compound, so as to improve the electrical performance of the second conductive layer 450.

S1035: Etch the third isolation layer, the second conductive layer, the second isolation layer and the BLC to form BL structures extending in the first direction, where each of the BL structures passes through multiple first contact regions located in the first direction.

The third isolation layer 460, the second conductive layer 450, the second isolation layer 410 and the BLC 440 are etched to form the BL structures 400 shown in FIG. 8. The BL structures 400 extend in the first direction. The BL structures 400 are in contact with multiple active regions 110 located in the same row or the same column through the BLCs 440. Among the BL structures 400, a part of some BL structure is in contact with the first contact region 111, and a part of some BL structure is in contact with the first insulating layer 300. That is, in the extension direction of the BL structures 400, the BL structures 400 are in contact with the first contact region 111 and the first insulating layer 300 alternately.

Referring 1 to 14, an embodiment of the present disclosure provides a semiconductor memory. The semiconductor memory includes a substrate 100, where the substrate 100 is provided to support each film layer thereon, and the substrate 100 is provided with active regions 110. There may be multiple active regions 110, and the multiple active regions 110 are arranged at intervals. For example, a STI structure is provided between the active regions 110, and the multiple active regions 110 are separated by the STI structure 120.

Each of the active regions 110 includes a first contact region 111 and second contact regions 112. The second contact regions 112 are located outside the first contact region 111. The first contact region 111 and the second contact regions 112 are exposed on a surface of the substrate 100. The first contact region 111 is used to electrically connect a BL structure 400, and the second contact regions 112 are used to electrically connect a capacitor. In some embodiments, the first contact region 111 is located in a central region of the active region 110, and the second contact regions 112 are located in peripheral regions of the active region 110. That is, the second contact regions 112 may be respectively provided on two sides of the first contact region 111.

The substrate 100 is further provided therein with WL structures 130. The WL structures 130 are generally BWL structures 130. There may be multiple BWL structures 130. The multiple BWL structures 130 extend in a second direction (an X direction in FIG. 6) and cross the active regions 110 to separate the first contact region 111 and the second contact regions 112 of each of the active regions 110.

The second contact regions 112 of the substrate 100 are provided with bumps 200. There are multiple bumps 200, and the multiple bumps 200 correspond to the multiple second contact regions 112 respectively, that is, one bump 200 is formed on one second contact region 112. Orthographic projection of the bump 200 on the substrate 100 at least covers the second contact region 112, that is, the second contact region 112 is located within the orthographic projection of the bump 200 on the substrate 100.

In some embodiments, a cross section of the bump 200 in a direction parallel to a first direction (a Y direction shown in FIG. 6) is arcuate. The first direction is the extension direction of the BL structure 400 provided on the substrate 100. The orthographic projection of the bump 200 on the substrate 100 and the second contact region 112 have the same shape, such as a parallelogram. A distance L between an edge of the orthographic projection of the bump 200 on the substrate 100 and an edge of the second contact region 112 is 3-5 nm.

In some embodiments, a surface of the bump 200 facing away from the substrate 100 is a curved surface, such that the area of the surface of the bump 200 facing away from the substrate 100 is greater than a surface area of the second contact region 112 exposed to the substrate 100. In this way, a subsequently formed wire 530 and the bump 200 have a large contact area, thereby reducing the contact resistance between the wire 530 and the bump 200.

Multiple BL structures 400 arranged at intervals are provided on the substrate 100. The multiple BL structures 400 are parallel and extend in the first direction. Each BL is electrically connected to at least one first contact region 111.

By contacting the BL structure 400 with the first contact region 111, the BL structure 400 is electrically connected to the first contact region 111.

Each of the BL structures 400 includes a third isolation layer 460, a second conductive layer 450, a second isolation layer 410 and a BLC 440. The BLC 440 and the second isolation layer 410 are alternately arranged. The BLC 440 is in contact with the first contact region 111, and the second isolation layer 410 is in contact with the first insulating layer 300. A top surface of the BLC 440 is flush with that of the second isolation layer 410. The second conductive layer 450 is provided on the BLC 440 and the second isolation layer 410 respectively, and the third isolation layer 460 is provided on the second conductive layer 450.

In some embodiments, the second conductive layer 450 includes a titanium layer, a metal compound layer and a tungsten layer. The titanium layer, the metal compound layer and the tungsten layer are sequentially stacked, and the titanium layer is in contact with the BLC 440. The metal compound layer may be made of metal silicide.

A first isolation layer 500 is provided on the substrate 100 and covers the BL structures 400. It supports and isolates the BL structures 400, and serves as a substrate body of filling holes 510. The first isolation layer 500 may be made of an insulating material, such as silicon nitride. Multiple filling holes 510 are formed in the first isolation layer 500, and the multiple filling holes 510 are arranged at intervals. Each of the filling holes 510 exposes one bump 200, that is, the multiple filling holes 510 correspond to multiple bumps 200 respectively.

The wire 530 is filled in the filling hole 510, and a top surface of the wire 530 is lower than that of the first isolation layer 500. The wire 530 is in contact with the bump 200. The wire 530 and the bump 200 are made of a conductive material, and the wire 530 and the bump 200 are electrically connected by contact. A contact area of the wire 530 and the bump 200 is greater than an overlapping area of orthographic projection of the filling hole 510 on the substrate 100 and the second contact region 112. In this way, the wire 530 and the bump 200 have a large contact area, thereby improving the electrical performance between the wire 530 and the bump 200.

A contact pad 610 is correspondingly provided on each wire 530. Multiple contact pads 610 are arranged at intervals to electrically isolate the contact pads 610. A lower part of the contact pad 610 is located in the filling hole 510 and is in contact with the wire 530, and an upper part of the contact pad 610 is located on the first isolation layer 500. A capacitor may be provided on the contact pad 610, and the capacitor is electrically connected to the second contact region 112 through the contact pad 610 and the wire 530.

The semiconductor memory in the embodiment of the present disclosure includes: a substrate 100, BL structures 400, a first isolation layer 500 and wires 530. The substrate 100 is provided with multiple active regions 110 arranged at intervals. Each of the active regions 110 includes a first contact region 111 and second contact regions 112. The second contact regions 112 are located outside the first contact region 111, and each of the second contact regions 112 is provided thereon with a bump 200. The BL structures 400 are provided on the substrate 100. Among the multiple BL structures 400 arranged at intervals, each of the BL structures 400 is electrically connected to at least one first contact region 111. The first isolation layer 500 is provided on the substrate 100 and covers the BL structures 400, the bump 200 and the substrate 100. Multiple filling holes 510 are provided in the first isolation layer 500, and each of the filling holes 510 exposes one bump 200. The wire 530 is provided in each of the filling holes 510 and is electrically connected to the bump 200. A contact area between the wire 530 and the bump 200 is greater than an overlapping area of the orthographic projection of the filling hole 510 on the substrate 100 and the second contact region 112. In this way, the contact area between the wire 530 and the bump 200 is greater than the overlapping area of the wire 530 and the second contact region 112 when the bump 200 is not provided, thereby reducing the contact resistance between the wire 530 and the bump 200. In addition, compared with the related art, since the bump 200 on the substrate 100 is formed in the filling hole 510, the depth of the filling hole 510 is reduced. Therefore, the probability of a void or a gap formed in the wire 530 provided in the filling hole 510 is reduced, thereby improving the formation quality of the wire 530 and improving the yield of the memory.

Each embodiment or implementation in the specification of the present disclosure is described in a progressive manner. Each embodiment focuses on the difference from other embodiments, and the same and similar parts between the embodiments may refer to each other.

In the descriptions of this specification, the description with reference to the term "one implementation", "some implementations", "an exemplary implementation", "an example", "a specific example" or "some examples" means that a specific feature, structure, material or characteristic described in combination with the implementation(s) or example(s) is included in at least one implementation or example of the present disclosure. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present disclosure.

The invention claimed is:

1. A method of manufacturing a semiconductor memory, comprising:
providing a substrate, wherein multiple active regions arranged at intervals are provided in the substrate; each of the active regions comprises a first contact region and second contact regions located outside the first contact region; and the second contact regions are exposed on a surface of the substrate;
forming a bump on each of the second contact regions;
forming multiple bit line structures arranged at intervals on the substrate, each of the bit line structures being electrically connected to at least one first contact region;
forming a first isolation layer covering the bit line structures and covering the substrate, wherein multiple filling holes are provided in the first isolation layer; one of the filling holes exposes one bump, and a surface area of the bump exposed in the filling hole is greater than an overlapping area of orthographic projection of the filling hole on the substrate and the second contact region; and forming a wire in each of the filling holes, the wire being electrically connected to the bump.

2. The method of manufacturing a semiconductor memory according to claim 1, wherein the bit line structures extend in a first direction; and a cross section of the bump in a direction parallel to the first direction is arcuate.

3. The method of manufacturing a semiconductor memory according to claim 1, wherein orthographic projection of the bump on the substrate at least covers the second contact region.

4. The method of manufacturing a semiconductor memory according to claim 3, wherein a distance between an edge of the orthographic projection of the bump on the substrate and an edge of the second contact region is 3-5 nm.

5. The method of manufacturing a semiconductor memory according to claim 1, wherein the forming a bump on each of the second contact regions comprises:

forming the bump on each of the second contact regions by epitaxial growth.

6. The method of manufacturing a semiconductor memory according to claim 5, wherein a material of the bump is the same as a material of the active region; the bump and the active region are doped with preset ions; and a doping concentration of the bump is greater than a doping concentration of the active region.

7. The method of manufacturing a semiconductor memory according to claim 1, wherein the first contact region is exposed on the surface of the substrate; and a bump is formed on each first contact region, while a bump is formed on each of the second contact regions.

8. The method of manufacturing a semiconductor memory according to claim 7, wherein word line structures extending in a second direction are further provided in the substrate; the word line structures separate the first contact region and the second contact regions of each of the active regions; and the first contact region and the second contact regions are arranged in a dot array.

9. The method of manufacturing a semiconductor memory according to claim 1, wherein the forming multiple bit line structures arranged at intervals on the substrate, each of the bit line structures being electrically connected to at least one first contact region comprises:

forming a first insulating layer, a second isolation layer and a first conductive layer that are stacked on the substrate, wherein the first insulating layer covers the bump;

forming bit line contact windows in the first conductive layer, in the second isolation layer and in the first insulating layer; wherein each of the bit line contact windows penetrates the first conductive layer, the second isolation layer and the first insulating layer and extends to the substrate; and the bit line contact window exposes the first contact region;

forming a bit line contact in each of the bit line contact windows, and removing the first conductive layer on the second isolation layer and the bit line contact above the second isolation layer, such that a retained bit line contact is flush with the second isolation layer;

forming, on the bit line contact and the second isolation layer, a second conductive layer and a third isolation layer that are stacked, wherein the second conductive layer covers the bit line contact and the second isolation layer; and etching the third isolation layer, the second conductive layer, the second isolation layer and the bit line contact, to form the bit line structures extending in a first direction, wherein each of the bit line structures passes through multiple first contact regions located in the first direction.

10. The method of manufacturing a semiconductor memory according to claim 9, wherein the second conductive layer comprises a titanium layer formed on the bit line contact, a metal compound layer formed on the titanium layer and a tungsten layer formed on the metal compound layer.

11. The method of manufacturing a semiconductor memory according to claim 9, wherein the forming a first isolation layer covering the bit line structures and covering the substrate, wherein multiple filling holes are provided in the first isolation layer; one of the filling holes exposes one bump, and a surface area of the bump exposed in the filling hole is greater than an overlapping area of orthographic projection of the filling hole on the substrate and the second contact region comprises:

depositing the first isolation layer on the bit line structures, such that the first isolation layer covers the bit line structures and the first insulating layer;

etching the first isolation layer to form the filling holes, wherein each of the filling holes penetrates the first isolation layer and is opposite to the bump; and etching the first insulating layer along the filling holes, wherein each of the filling holes penetrates the first insulating layer so as to expose the bump.

12. The method of manufacturing a semiconductor memory according to claim 1, wherein the forming a wire each of the filling holes, the wire being electrically connected to the bump comprises:

depositing a third conductive layer in the filling holes and on the first isolation layer, wherein the third conductive layer fills the filling holes and covers the first isolation layer; and etching the third conductive layer, so as to remove the third conductive layer located on the first isolation layer and a part of the third conductive layer located in the filling holes, such that a retained third conductive layer forms the wire.

13. The method of manufacturing a semiconductor memory according to claim 12, wherein after the forming a wire in each of the filling holes, the wire being electrically connected to the bump, the method of manufacturing the semiconductor memory further comprises:

forming a contact pad on the wire in each of the filling holes, wherein multiple contact pads are arranged at intervals; and the contact pad is partially located in the filling hole and partially located on the first isolation layer.

14. A semiconductor memory, comprising:

a substrate, wherein the substrate is provided with multiple active regions arranged at intervals; and each of the active regions comprises a first contact region and second contact regions located outside the first contact region;

multiple bit line structures, wherein the bit line structures are arranged at intervals on the substrate, and each of the bit line structures is electrically connected to at least one first contact region;

a bump, arranged on each of the second contact regions;

a first isolation layer, wherein the first isolation layer covers the bit line structures, the bump and the substrate; the first isolation layer is provided with multiple filling holes, and each of the multiple filling holes extends to the bump; and a wire arranged in each of the filling holes, wherein the wire is electrically connected to the bump; and a contact area of the wire and the bump is greater than an overlapping area of orthographic projection of the filling hole on the substrate and the second contact region.

15. The semiconductor memory according to claim 14, wherein the bit line structures extend in a first direction; and a cross section of the bump in a direction parallel to the first direction is arcuate.

16. The semiconductor memory according to claim 14, wherein orthographic projection of the bump on the substrate at least covers the second contact region.

17. The semiconductor memory according to claim 16, wherein a distance between an edge of the orthographic projection of the bump on the substrate and an edge of the second contact region is 3-5 nm.

18. The semiconductor memory according to claim 14, wherein the bump arranged on each of the second contact regions is formed by epitaxial growth.

19. The semiconductor memory according to claim 18, wherein a material of the bump is the same as a material of the active region; the bump and the active region are doped with preset ions; and a doping concentration of the bump is greater than a doping concentration of the active region.

20. The semiconductor memory according to claim 19, wherein the first contact region is exposed on a surface of the substrate; and a bump is arranged on each first contact region, while a bump is arranged on each of the second contact regions.

* * * * *